(12) United States Patent
Kim

(10) Patent No.: US 7,767,536 B2
(45) Date of Patent: Aug. 3, 2010

(54) SEMICONDUCTOR DEVICE AND FABRICATING METHOD THEREOF

(75) Inventor: Tae Woo Kim, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 350 days.

(21) Appl. No.: 11/025,376

(22) Filed: Dec. 28, 2004

(65) Prior Publication Data

US 2005/0151174 A1 Jul. 14, 2005

(30) Foreign Application Priority Data

Dec. 31, 2003 (KR) .................. 10-2003-0101818

(51) Int. Cl.
*H01L 21/336* (2006.01)
(52) U.S. Cl. .................. 438/307; 438/174; 438/289; 438/290
(58) Field of Classification Search .................. 438/174, 438/180, 181, 217, 289, 290, 299, 301, 305–307; 257/E21.438, 349, 394, 408
See application file for complete search history.

(56) References Cited

U.S. PATENT DOCUMENTS

| 5,899,732 A * | 5/1999 | Gardner et al. .............. 438/473 |
| 6,452,236 B1 * | 9/2002 | Nadakumar et al. ......... 257/356 |
| 6,632,478 B2 * | 10/2003 | Gaillard et al. ........ 427/255.37 |
| 6,822,297 B2 * | 11/2004 | Nandakumar et al. ....... 257/356 |
| 7,151,032 B2 * | 12/2006 | Kim .......................... 438/286 |

* cited by examiner

*Primary Examiner*—Matthew C Landau
*Assistant Examiner*—Candice Y Chan
(74) *Attorney, Agent, or Firm*—The Law Offices of Andrew D. Fortney; Andrew D. Fortney; Sharon E. Brown Turner

(57) ABSTRACT

A semiconductor device and fabrication method thereof are disclosed. An example semiconductor device includes a semiconductor substrate having a device isolation area defining an active area; a gate oxide layer formed on the active area of the substrate; a gate on the gate oxide layer; a spacer provided to a sidewall of the gate; and a well region provided within the active area. The well region includes a threshold voltage adjustment doped region, a halo region, a source region, a drain region, an additional doped region, and a channel stop region, the additional doped region provided between the well region and each of the source and drain regions.

20 Claims, 4 Drawing Sheets

SEMICONDUCTOR DEVICE AND FABRICATING METHOD THEREOF

RELATED APPLICATION

This application claims the benefit of the Korean Application No. P2003-0101818 filed on Dec. 31, 2003, which is hereby incorporated by reference.

TECHNICAL FIELD

The present disclosure relates to a semiconductor device and fabricating method thereof.

BACKGROUND

Generally, as the degree of integration of a semiconductor device increases, the physical dimensions of a transistor such as a gate oxide thickness, a gate spacer width and the like abruptly decrease. Specifically, in case of low power consumption product, a transistor size reduction failing to be accompanied with a lowered supply voltage needs to sustain a minimum leakage current.

There are various kinds of leakage current such as junction leakage current, gate induced drain leakage current, Ioff (punch-thru) leakage current, and the like. Because the Ioff leakage current is the largest, a threshold voltage is raised to lower the leakage current flowing in a channel region.

However, even if a doping concentration of a threshold voltage adjustment doped region is raised to raise the threshold voltage, the high doping concentration increases an electric field between a well and a source/drain junction to generate the junction leakage current. As a result, the junction leakage current is not reduced despite the raised threshold voltage.

DETAILED DESCRIPTION

In general, the example methods and apparatus described herein provide a semiconductor device and fabricating method thereof by which junction leakage current is minimized. An example semiconductor device includes a semiconductor substrate having a device isolation area defining an active area, a gate oxide layer formed on the active area of the substrate, a gate on the gate oxide layer, a spacer provided to a sidewall of the gate, and a well region provided within the active area, the well region including a threshold voltage adjustment doped region, a halo region, a source region, a drain region, an additional doped region, and a channel stop region, the additional doped region provided between the well region and each of the source and drain regions. Preferably, the threshold voltage adjustment doped region lies 250~300 Å below a surface of the semiconductor substrate and, preferably, the additional doped region lies 700~1,200 Å below a surface of the semiconductor substrate.

An example method of fabricating a semiconductor device forms a device isolation area on a semiconductor substrate to define an active area therein, forms a well region, a channel stop region, and a threshold voltage adjustment doped region in the active area by implanting impurity ions in the active area at different depths, respectively, stacks a gate oxide layer and a gate on the active area of the substrate, forms lightly doped regions and halo regions in prescribed regions in the active area of the substrate, forms a spacer on a sidewall of the gate, and dopes prescribed regions in the active area of the substrate to form source and drain regions and additional doped regions. Preferably, the source and drain regions and the additional ion doped regions are doped with same impurity ions. Preferably, each of the additional doped regions is doped at a concentration of 5.0E13~1.0E14 ions/cm$^3$.

Reference will now be made in detail to the examples in the accompanying drawings. Wherever possible, the same reference numbers will be used throughout the drawings to refer to the same or like parts.

Figure 1:
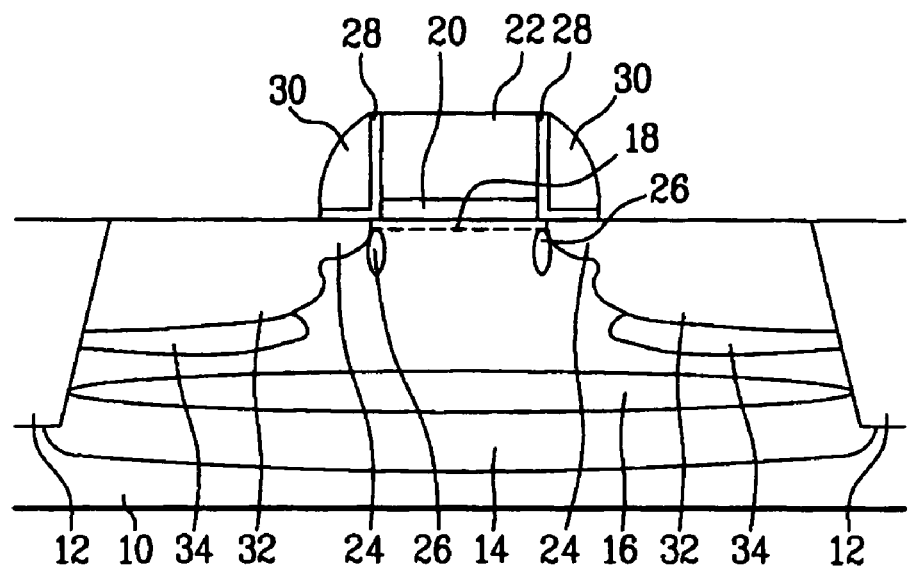
FIG. 1 is a cross-sectional diagram of an example semiconductor device.

FIG. 1 is a cross-sectional diagram of an example semiconductor device in which a PMOS transistor is shown. Referring to FIG. 1, a plurality of active areas are defined in a semiconductor substrate 10 by a device isolation area 12, and a well 14 doped with N or P-type impurity ions is provided to each of the active areas. In this example, the well 14 is doped with N-type impurity ions.

In the well 14, source and drain regions 32 heavily doped with impurity ions are formed. A channel region of intrinsic semiconductor is formed between the source and drain regions 32. A threshold voltage adjustment doped region 18 for adjusting a threshold voltage of a transistor is formed in the channel region. Preferably, the threshold voltage adjustment doped region 18 has a depth of 150~300 Å from a surface of the substrate 10.

A gate 22 is formed on the channel region and a spacer 30 is provided to a sidewall of the gate 22. A buffer oxide layer 28 is inserted between the gate 22 and the spacer 30 to reduce a stress in-between, and a gate oxide layer 20 is inserted between the gate 22 and the substrate 10. Lightly doped regions 24 lightly doped with impurity ions are formed in the substrate 10 between the gate 22 and the source and drain regions 32, respectively. A channel stop region heavily doped with N-type impurity ions 16 is formed in the substrate 10 under the source and drain regions 32 to prevent diffusion of the impurity ions doping the source and drain regions 32, and a halo region 26 is formed in a prescribed area of the channel region to prevent punch-through. A doped region 34 doped with P-type impurity ions by 5.0E13~1.0E14 ions/cm$^3$ is formed between the channel stop region 16 and the source/drain region 32. Preferably, the doped region 34 is embedded in the substrate 10 to the depth of 700~1,200 Å.

In the example semiconductor device, the doped region 34 is provided between the channel stop region 16 and the source/drain region 32 to reduce an electric field between the channel region and the source/drain region 32, thereby minimizing leakage current generated between the channel region and the source/drain region 32.

Figure 2:
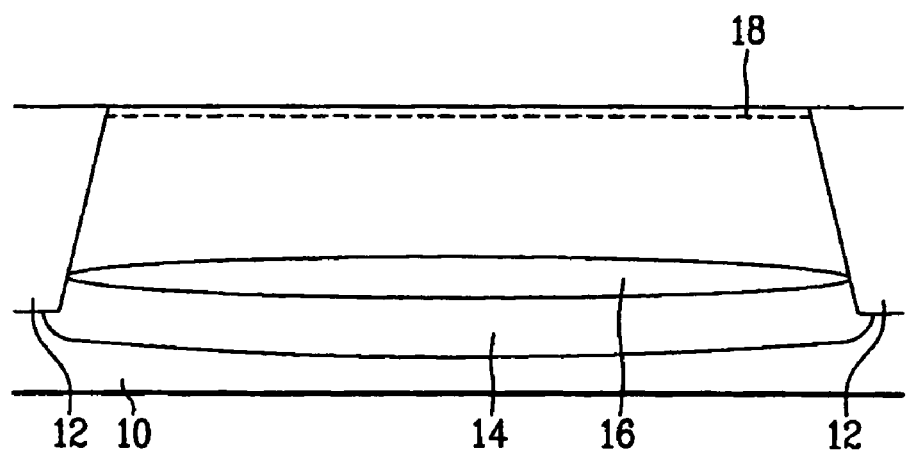
FIGS. 2 to 4 are cross-sectional diagrams depicting an example method of fabricating a semiconductor device.
Figure 3:
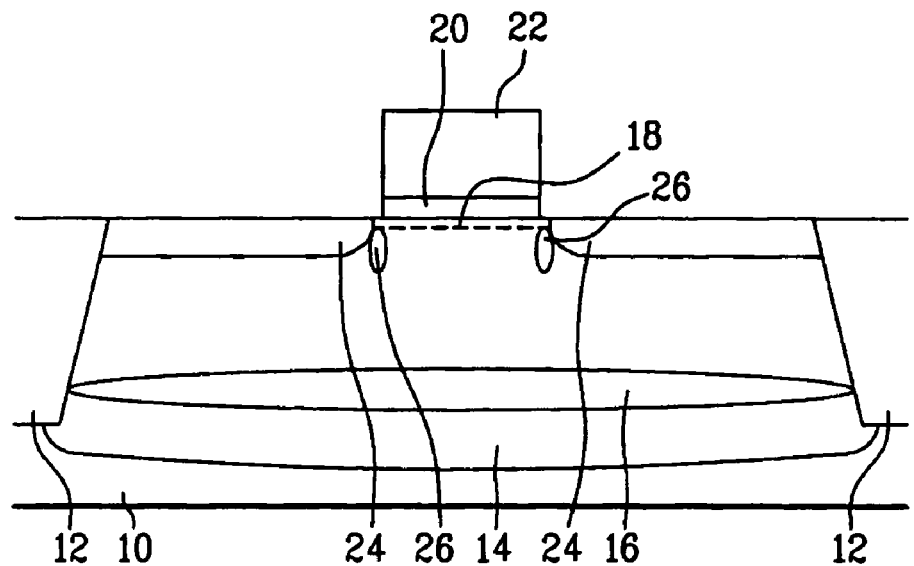
Figure 4:
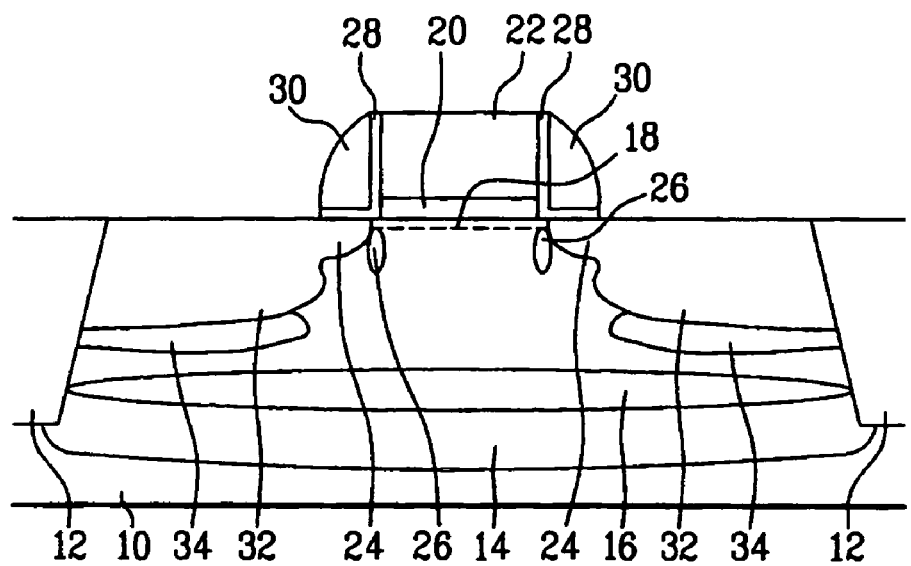

FIGS. 2 to 4 are cross-sectional diagrams for explaining an example method of fabricating a semiconductor device. Referring to FIG. 2, a device isolation area 12 is formed in a semiconductor substrate 10 by LOCOS or STI to define an active area in the semiconductor substrate 10. A well region 14, channel stop region 16, and threshold voltage adjustment doped region 18 are formed in the substrate to differ in depth from a surface of the substrate with different doping energy. A doping sequence follows the order of the well region 14, the channel stop region 16, and the threshold voltage adjustment doped region 18. In doing so, a dopant type is N, and the N-type dopant includes P, As, etc. Specifically, the threshold voltage adjustment doped region 18 is provided to the depth of 100~300 Å from the surface of the substrate 10.

Referring to FIG. 3, thermal oxidation is carried out on the substrate 10 to form a pad oxide layer on the substrate 10. The pad oxide layer, which is a buffer layer to protect the substrate against subsequent steps, is formed to have a minimum thickness enough not to be broken at a prescribed voltage. Polysilicon is deposited on the pad oxide layer to form a polysilicon layer. The polysilicon layer and the pad oxide layer are selectively etched to form a gate 22 and a gate oxide layer 20 on the threshold voltage adjustment doped region 18. A halo region 26 is formed in the active area of the substrate 10 using the gate 22 as a doping mask. Subsequently, lightly doped regions 24 are formed in the active area of the substrate 10 to be aligned with the gate 22. A width of a channel region is defined by the lightly doped regions 24, and the halo region 26 is formed between the channel region and each of the lightly doped regions 24. In doing so, the lightly doped regions 24 are doped with P-type impurity ions and the halo region 26 is doped with N-type impurity ions. And, the P-type impurity ions include B, Ga, etc.

Referring to FIG. 4, an oxide layer is formed over the substrate 10 to cover the gate 22 and a nitride layer is formed on the oxide layer. The nitride and oxide layers are etched by blank etch or etch-back to form a spacer 30 and a buffer oxide layer 28. Subsequently, source and drain regions 32 are formed in prescribed portions of the active area of the substrate 10, respectively, by impurity ion doping using the gate 22, buffer oxide layer 28, and spacer 30 as a doping mask. Additionally, the source and drain regions 32 are doped with P-type impurity ions at a dose heavier than that of the lightly doped regions 24.

Thereafter, additional ion doped regions 34, as shown in FIG. 1, are formed beneath the source and drain regions 32, respectively, by additional ion doping. In doing so, P-type impurity is used as a dopant such as boron at a concentration of 5.0E13~1.0E14 ions/cm$^3$.

The additional ion doped regions 34 lie beneath the source and drain regions 32 above the channel stop region 16, respectively. Preferably, the additional ion doped regions 34 are formed 700~1,200 Å distant from a surface of the substrate 100. Hence, the additional ion doped region 34 weakens the electric field between the gate 22 and the source/drain region 32, thereby decreasing leakage current to minimize semiconductor device failure due to the leakage current. This can be seen in the example graphs in FIGS. 5 to 7.

Figure 5:
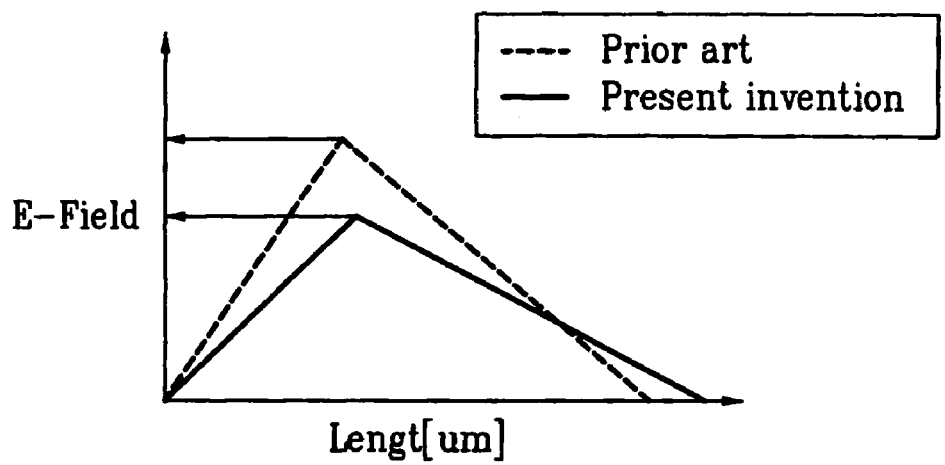
FIG. 5 is an example graph of an electric field between a channel region and source/drain junction according to a depth from a surface of a semiconductor substrate.
Figure 6:
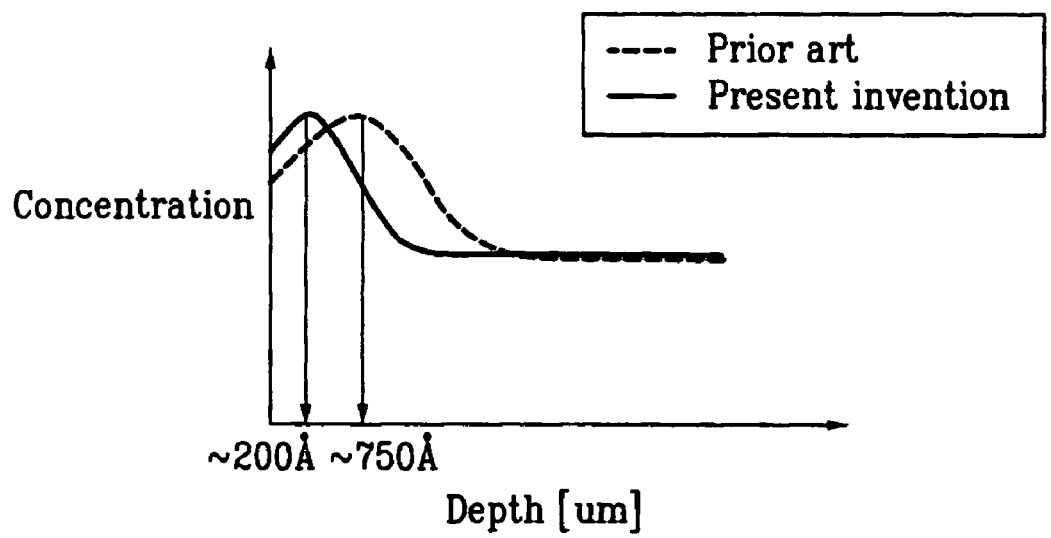
FIG. 6 is an example graph of an ion doped concentration according to a doping profile of threshold voltage adjustment ions in an example semiconductor device.
Figure 7:
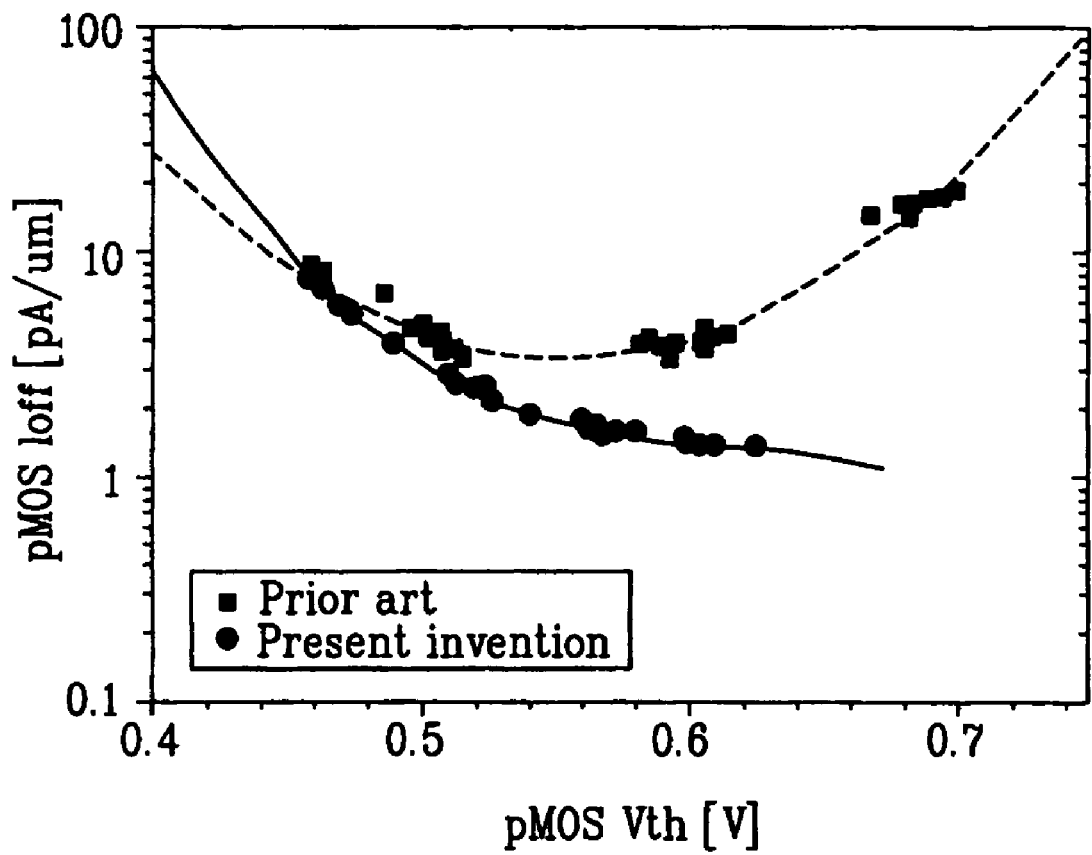
FIG. 7 is an example graph of leakage current variation according to threshold voltage.

FIG. 5 is an example graph of an electric field between a channel region and source/drain junction according to a depth from a surface of a semiconductor substrate, FIG. 6 is an example graph of an ion doped concentration according to a doping profile of threshold voltage adjustment ions in an example semiconductor device, and FIG. 7 is an example graph of leakage current variation according to threshold voltage.

Referring to FIG. 5, an electric field of the example semiconductor device is considerably reduced compared to known semiconductor devices. Namely, in the example semiconductor device described herein, the doped additional region 34 in FIG. 1 reduces the electric field between the source and drain regions. As a result, the leakage current due to the electric field generated between the source and drain regions can be minimized.

Referring to FIG. 5 and FIG. 6, a maximum of the electric field appears at a maximum doping value of the threshold voltage adjustment doped region. To improve the maximum of the electric field, the doping profile of the threshold voltage adjustment doped region should be formed adjacent to the substrate surface. The closer the threshold voltage adjustment doping profile is to the substrate surface, the more the dopant concentration of the threshold voltage adjustment doped region is lowered. Thus, the electric field between the channel region and the source/drain junction can be weakened.

In the example semiconductor device described herein, the threshold voltage adjustment doped region is formed in the depth of 150~300 Å away from the substrate surface. Thus, as shown in FIG. 6, the electric field is lowered. Additionally, with the example semiconductor device and method described herein, the additional doped region is provided between the well region and the source/drain region, whereby the electric field between the well region and the source/drain junction can be weakened. As a result, the leakage current (Ioff leakage) is not increased despite the raised threshold voltage. Accordingly, the examples described herein further employ the additional ion doped region to minimize the leakage current due to the electric field between the gate and the source/drain region, thereby enhancing reliability and quality of the semiconductor device.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of fabricating a semiconductor device, comprising:

forming a device isolation area on a semiconductor substrate to define an active area therein;

forming a well region, a channel stop region, and a threshold voltage adjustment doped region in the entire active area by implanting impurity ions in the active area at different depths, respectively;

after forming the well region, channel stop region, and threshold voltage adjustment doped region, stacking a gate oxide layer and a gate on the active area of the substrate;

forming lightly doped regions and halo regions in prescribed regions in the active area of the substrate;

forming a spacer on a sidewall of the gate; and using the gate and the spacer as a mask, forming source and drain regions in prescribed regions in the active area of the substrate; and using the gate and the spacer as a mask, separately forming additional doped regions below the source and drain regions and above the channel stop region, wherein the additional doped regions and the source and drain regions are doped with the same impurity ions.

2. The method of claim 1, wherein each of the additional doped regions is doped at a concentration of 5.0E13~1.0E14 ions/cm$^3$.

3. The method of claim 1, wherein the additional doped region is formed 700~1,200 Å below a surface of the semiconductor substrate.

4. The method of claim 1, wherein forming the device isolation layer comprises LOCOS or STI.

5. The method of claim 1, wherein the threshold voltage adjustment doped region is formed at a depth of 100~300 Å from a surface of the substrate.

6. The method of claim 1, wherein the lightly doped regions are aligned with the gate.

7. The method of claim 1, wherein the well region and the channel stop region are doped with same impurity ions.

8. The method of claim 1, wherein the channel stop region is heavily doped.

9. The method of claim 1, wherein the channel stop region has a depth less than a depth of the well region.

10. The method of claim 1, wherein the additional doped regions function to weaken the electric field between the gate and source/drain region.

11. The method of claim 1, wherein forming the spacer further comprises forming a buffer oxide layer between the gate and the spacer.

12. The method of claim 1, wherein the source and drain regions are doped at a dose heavier than that of the lightly doped regions.

13. The method of claim 1, wherein the well region, the channel stop region, and the threshold voltage adjustment doped regions are doped with N-type impurity ions.

14. The method of claim 13, wherein the N-type impurity ions comprise P or As.

15. The method of claim 13, wherein the N-type impurity ions comprise P.

16. The method of claim 1, wherein the source and drain regions and the additional doped regions are doped with P-type impurity ions.

17. The method of claim 16, wherein the P-type impurity ions comprise B or Ga.

18. The method of claim 16, wherein the P-type impurity ions comprise B.

19. The method of claim 1, wherein the halo region is formed in the active area of the substrate using the gate as a mask.

20. The method of claim 1, wherein forming the spacer comprises forming an oxide layer over the substrate; forming a nitride layer on the oxide layer; and etching the nitride and oxide layers.

* * * * *